(12) United States Patent
Casagrande et al.

(10) Patent No.: US 11,251,750 B1
(45) Date of Patent: Feb. 15, 2022

(54) CRYSTAL OSCILLATOR AND STARTUP METHOD FOR A CRYSTAL OSCILLATOR

(71) Applicant: The Swatch Group Research and Development Ltd, Marin (CH)

(72) Inventors: Arnaud Casagrande, Bole (CH); Jean-Luc Arend, Corcelles (CH)

(73) Assignee: The Swatch Group Research and Development Ltd, Marin (CH)

( * ) Notice: Subject to any disclaimer, the term of this patent is extended or adjusted under 35 U.S.C. 154(b) by 0 days.

(21) Appl. No.: 17/326,434

(22) Filed: May 21, 2021

(30) Foreign Application Priority Data

Sep. 7, 2020 (EP) .................................. 20194781

(51) Int. Cl.
*H03B 5/06* (2006.01)
*H03B 5/32* (2006.01)
*H03L 3/00* (2006.01)

(52) U.S. Cl.
CPC ............... *H03B 5/323* (2013.01); *H03B 5/06* (2013.01); *H03B 5/32* (2013.01); *H03L 3/00* (2013.01); *H03B 2200/0094* (2013.01)

(58) Field of Classification Search
CPC ................ H03B 5/06; H03B 5/30–368; H03B 2200/0094; H03L 3/00
See application file for complete search history.

(56) References Cited

U.S. PATENT DOCUMENTS

| | | | |
|---|---|---|---|
| 6,121,849 A * | 9/2000 | McCollough | H03L 3/00 331/1 R |
| 10,581,378 B1 | 3/2020 | Verhoef | |
| 10,951,166 B1 * | 3/2021 | Kruiskamp | H03B 5/06 |
| 2008/0105054 A1 | 5/2008 | Kanai et al. | |
| 2010/0237958 A1 | 9/2010 | Goel et al. | |
| 2011/0197674 A1 * | 8/2011 | Prandi | G01C 19/5726 73/504.12 |
| 2012/0299651 A1 | 11/2012 | Goel et al. | |
| 2014/0070897 A1 * | 3/2014 | Brekelmans | H03L 5/00 331/109 |
| 2015/0333694 A1 | 11/2015 | Griffith et al. | |
| 2016/0218671 A1 * | 7/2016 | Jun | H03B 5/364 |

OTHER PUBLICATIONS

European Search Report dated Feb. 18, 2021 in European Application 20194781.9 filed on Sep. 7, 2020, 3 pages (with English Translation of Categories of Cited Documents).

* cited by examiner

*Primary Examiner* — Levi Gannon
(74) *Attorney, Agent, or Firm* — Oblon, McClelland, Maier & Neustadt, L.L.P.

(57) ABSTRACT

A crystal oscillator and a startup method for initiating operation of a crystal oscillator, the crystal oscillator includes an oscillator structure including a crystal resonator and an electronic oscillator circuit connected to the crystal resonator, the oscillator structure having a first terminal and a second terminal, a startup controller operable to initiate an oscillation in the oscillator structure by exciting the oscillator structure with a sequence of excitation signals derivable from a clock signal and when triggered by a timing signal, the sequence of excitation signals includes at least a first excitation signal and a second excitation signal, a comparator including a first and a second input terminal and an output terminal, the first input terminal being connected to the first terminal and wherein the second input terminal is connected to the second terminal.

15 Claims, 2 Drawing Sheets

CRYSTAL OSCILLATOR AND STARTUP METHOD FOR A CRYSTAL OSCILLATOR

CROSS-REFERENCE TO RELATED APPLICATION

This application claims priority to European Patent Application No. 20194781.9 filed on Sep. 7, 2020, the entire disclosure of which is hereby incorporated herein by reference.

FIELD OF THE INVENTION

The present disclosure relates to a crystal oscillator and to a portable electronic device comprising such a crystal oscillator. In another aspect the disclosure relates to a method of initiating operation of a crystal oscillator.

BACKGROUND OF THE INVENTION

Crystal oscillators are widely known in the prior art. A crystal oscillator is an electronic oscillating circuit that uses the mechanical resonance of a vibrating crystal of piezoelectric material to create an electric signal with a precise frequency. This frequency is often used to keep track of time, as in quartz-controlled wristwatches in order to provide a stable clock signal for digital integrated circuits and/or to stabilize frequencies for radio transmitters and receivers.

Conventional crystal oscillators of the so-called Pierce- or Colpitts-type design are typically provided with two capacitors that are usually excited by a controller to provide a rather fast startup of the oscillator. For a fast startup of the crystal oscillator the crystal is usually electrically excited at its terminals. The terminals of the crystal are typically charged by a first and a second capacitor, respectively.

There exist so-called quick-start systems for crystal oscillators as well as a respective fast oscillating starting mechanisms to initiate or start operation of such crystal oscillators. Here, a comparator is usually provided to detect the exact phase of a signal present on the crystal resonator. In practical implementations the switching delay of the comparator depends on the amplitude of an input signal present at the comparator. This phenomenon is also known as dispersion. Insofar, the quality or precision of the phase information derived from the comparator may be somewhat affected. It may be even false.

It is therefore an aim of the present disclosure to reduce the impact of comparator dispersion on the retrieved phase information as much as possible. It is a particular aim to compensate dispersion of the comparator for the purpose of phase determination or phase estimation of the crystal resonator. It is a particular aim to provide a respective method of operating a crystal oscillator such that a detrimental effect on the phase information caused by the dispersion or switching delay of the comparator can be effectively reduced or even entirely compensated.

SUMMARY

The above demands will be solved by a crystal oscillator, by a portable electronic device as well as by a method of initiating operation of a crystal oscillator in accordance to the features of the independent claims. Further features of the invention are the subject of the dependent claims.

In one aspect there is provided a crystal oscillator. The crystal oscillator comprises an oscillator structure. The oscillator structure comprises a crystal resonator and an electronic oscillator circuit. The electronic oscillator circuit is connected to the crystal oscillator. The oscillator structure comprises a first terminal and a second terminal. Typically, the first terminal is connected to a first terminal of the crystal resonator and to a first terminal of the electronic oscillator circuit. Likewise, the second terminal of the oscillator structure is connected to a second terminal of the crystal resonator and to a second terminal of the electronic oscillator circuit.

The crystal oscillator further comprises a startup controller. The startup controller is operable to initiate an oscillation in the oscillator structure by exciting the oscillator structure with a sequence of excitation signals. The excitation signals are derivable from a clock signal when triggered by a timing signal. The sequence of excitation signals includes at least a first excitation signal and a second excitation signal. Typically, the startup controller is operable to excite the oscillator structure stepwise or in discrete steps. In a first step, a first excitation signal is used to excite the oscillator structure. Thereafter, the oscillator structure is allowed to oscillate or to swing before the startup controller injection excites the oscillator structure again with the second excitation signal.

First and second excitation signals may be of the same frequency or of different frequencies. The frequency or frequencies of first and second excitation signals as well as from further excitation signals of the sequence of excitation signals may be derived from a separate oscillator, e.g. from a RC oscillator of the startup controller.

The crystal oscillator further comprises a comparator. The comparator comprises a first input terminal and a second input terminal. The comparator further comprises an output terminal. The first input terminal is connected to the first terminal of the oscillator structure. The second input terminal of the comparator is connected to the second terminal of the oscillator structure. The comparator is operable to provide a comparative signal. The comparative signal is typically provided at the output terminal of the comparator.

The crystal oscillator further comprises a digital storage. The digital storage is configured to store digital data characterizing a switching delay of the comparator. Typically, the digital storage is configured to store digital data being indicative of a switching delay of the comparator. In typical implementations the digital data is indicative of the switching delay as a function of an amplitude of the signals present at the comparator.

The crystal oscillator further comprises a phase shifting unit coupled to the digital storage and coupled to the output terminal of the comparator. The phase shifting unit is operable to generate or to modify the timing signal on the basis of the comparative signal and on the basis of the digital data provided by the digital storage. In this way the dispersion of the comparator and the impact of the dispersion on the correct determination of the phase of the oscillator structure can be effectively compensated.

With typical implementations of the crystal oscillator a nonlinear behavior of the comparator, in particular the nonlinear dispersion of the comparator, i.e. a switching delay as a function of the amplitude of an input signal is constant over the lifetime of the comparator. So, for each comparator the characteristic data representing the dispersion can be stored in the digital storage.

As the oscillator structure is excited by the sequence of excitation signals in a well-defined and deterministic way the switching delay of the comparator for each excitation signal is known in principle. By storing the data representing the switching delay or dispersion of the comparator in a digital storage and by making use of this data during a fast oscillation startup procedure of the crystal oscillator the detrimental impact of the comparator dispersion can be effectively compensated. Insofar, the precision of phase determination of signals present on the crystal resonator or present on the electronic oscillator circuit for the purpose of exciting a subsequent excitation signal of a sequence of excitation signals can be improved.

According to a further embodiment the digital storage comprises a lookup table. The lookup table comprises a number of signal amplitudes and/or an ordinal number of excitation signals. Each one of the signal amplitudes and the ordinal numbers of excitation signals is assigned to a switching delay of the comparator and/or to a digital offset value usable by the phase shifting unit to compensate the switching delay of the comparator.

Typically, for each signal amplitude present at the input terminals of the comparator there is provided a well-defined switching delay or a respective digital offset value by the lookup table and/or by the digital storage.

Since the startup procedure conducted by the startup controller may follow a well-defined scheme and since the signal amplitudes present at the comparator may change in a deterministic way for each excitation signal of a temporal sequence of numerous excitation signals it may be also sufficient to assign the switching delay or a digital offset value of the comparator to the ordinal number of excitation signals. Hence, a first excitation event conducted or triggered by the startup controller and operable to generate a first excitation signal and to inject the first excitation signal into the oscillator structure is assigned with a first switching delay and/or with a first digital offset value. A second and hence a subsequent excitation event is assigned with a second switching delay or with a second digital offset value and so on.

According to another example the digital data stored in the digital storage comprises at least a first digital offset value for the first excitation signal at a second digital offset value for the second excitation signal. As described above, the excitation signals may be represented by a signal amplitude and/or by an ordinal number of excitation signals.

Typically, the startup controller and/or the phase shifting unit is/are operable to determine a signal amplitude of an input signal present at the first and/or at the second input terminal of the comparator and/or to determine the ordinal number of an excitation in order to enable selecting of the respective digital offset value of the switching delay from the digital storage.

According to another example the startup controller or the phase shifting unit is/are operable to select a digital offset value from the digital storage on the basis of a signal amplitude of the oscillation in the oscillator structure and/or on the basis of an ordinal number of an excitation signal of the sequence of excitation signal. For this, at least one of the startup controller and the phase shifting unit comprises either a counter to determine the ordinal number of a momentary excitation signal. Alternatively, at least one of the startup controller and the phase shifting unit is provided with a feedback unit operable to provide the signal amplitude of the signals present at first and/or second input terminals of the comparator.

In this way the startup controller and/or the phase shifting unit will be operable to select a suitable or matching digital offset value or a respective switching delay from the digital storage that matches the momentary switching delay and/or dispersion of the comparator.

According to another example the startup controller is operable in a calibration mode in which switching delays of the comparator for a sequence of excitation signals are measured or determined. Here and when in the calibration mode the digital data to be stored in the digital storage is derived from switching delays measured or measurable at the comparator.

In this way and since the crystal oscillator is operable in such a calibration mode, for each comparator of a given crystal oscillator the respective switching delays and/or the data characterizing the dispersion of the comparator can be individually determined and stored in the available digital storage. In this way, the crystal oscillator can be individually calibrated and manufacturing tolerances as well as inevitable electronic tolerances of the comparator can be effectively compensated for.

According to another example the digital data stored in the digital storage is derived from the measured switching delay of the comparator such that the timing signals generated or modified provide to effectively compensate the switching delay of the comparator. In other words, the data actually stored in the digital storage may comprise one of numerous available formats. With one approach the switching delay of the comparator may be stored in the digital storage and may be assigned to a signal amplitude and/or to an ordinal number of an excitation signal.

With other approaches the data to be stored in the digital storage may be pre-processed. It may be stored in such a format in the digital storage that is readily usable by the phase shifting unit. For instance, the digital data stored in the digital storage may be pre-processed and may be stored as a digital phase offset readily usable by the phase shifting unit so that during an ordinary operation or driving of the crystal oscillator the digital data provided by the digital storage is directly processable by the phase shifting unit. In this way, a computational effort to be provided by the phase shifting unit can be reduced to a minimum.

The phase shifting unit may be implemented as a digital phase shifting unit. A digital phase shifting unit is of particular benefit when the data stored in the digital storage is provided digitally.

With other implementations the phase shifting unit may be implemented as an analog phase shifting unit. Then, at least one of an input of the phase shifting unit connected to the digital storage and an output of the digital storage connected to the input of the phase shifting unit is provided with a digital analog converter. In this way also an analog phase shifting unit can be used in combination with a digital data storage.

With another example the crystal oscillator of the digital storage comprises a one-time programmable memory. Here and when in the calibration mode the one-time programmable memory is programmed and the respective lookup table is provided with individual digital data characterizing the dispersion or the switching delay of the comparator of the respective crystal oscillator. The one-time programmable memory may be implemented as a flash memory device.

According to another example the crystal oscillator comprises a synchronizer. The synchronizer comprises a clock input, a comparator input and a synchronizer output. The comparator input is connected to the output terminal of the comparator and the synchronizer output is connected to an input terminal of the phase shifting unit. The synchronizer is typically operable to synchronize the signal provided at the output of the comparator with a signal derived from a clock signal. In this way the timing signals for a subsequent excitation signal of the sequence of excitation signals can be adjusted with regard to its phase.

According to another example the synchronizer is operable to generate the timing signal on the basis of signals obtained by the clock input and via the comparator input. In this way, the synchronizer is operable to generate the timing signals by taking into account the exact phase of the oscillation in the oscillator structure caused by a preceding excitation regional. By synchronizing a signal received from the comparator via the comparator input with a signal obtained by a clock input the proceeding timing signal is generated in such a way that a phase of a subsequently generated excitation signal triggered by the timing signal matches with the phase of the actual oscillation in the oscillator structure. With the phase shifting unit downstream of the synchronizer a phase shift due to dispersion of the comparator can be effectively compensated.

According to another example the crystal oscillator comprises an oscillator, typically a RC oscillator coupled to a phase locked loop. An output terminal of the phase locked loop is connected to an input terminal of the phase shifting unit and/or to the clock input of the synchronizer. In this way, operation of the synchronizer and operation of the phase shifting unit can be mutually synchronized.

According to another aspect there is provided a portable electronic device. The portable electronic device may be implemented as a wearable electronic device configured to be worn by a user. The portable electronic device comprises a housing, an electric source of energy and a crystal oscillator as described above and being arranged inside the housing. Here, the crystal oscillator is driven or powered by the electric source of energy. The electric source of energy may comprise a battery. The battery may be implemented as a rechargeable battery. The portable or wearable electronic device may be implemented as a watch, as a wrist watch or as a smart watch. The crystal oscillator provides a clock signal and hence an output terminal providing a well-defined clock for driving an electronic circuit of the portable electronic device.

According to a further example the portable electronic device comprises a display and a clockwork mechanism. The clockwork mechanism is operably connected to the display. The clockwork mechanism comprises the crystal oscillator. The clockwork mechanism may be implemented mechanically and/or electronically. When implemented mechanically, a clockwork mechanism comprises at least the crystal oscillator as described above that provides a well-defined clock signal for driving of the mechanically implemented clockwork mechanism.

According to another aspect there is provided a method of initiating operation of a crystal oscillator. The method is particularly configured to initiate a fast oscillation startup of the crystal oscillator as described above. The method comprises the steps of providing a timing signal and generating a first excitation signal and initiating an oscillation in an oscillator structure of the crystal oscillator by exciting the oscillator structure with the first excitation signal triggered by the timing signal. In a subsequent step a comparative signal is derived by using a comparator connected to first and second terminals of the oscillator structure or the crystal oscillator as described above.

The method is characterized by deriving digital data being indicative of a switching delay of the comparator and storing the digital data in a digital storage.

Additionally or alternatively, the method is characterized by retrieving digital data being indicative of a switching delay of the comparator from a digital storage and generating or modifying the timing signal on the basis of the comparative signal and on the basis of the digital data for exciting the oscillator structure with a second excitation signal. In this way the method provides calibration of the oscillator structure when in a calibration mode as well as driving the crystal oscillator by making use of digital data stored in the digital storage and being indicative of a switching delay or dispersion of the comparator.

In this way the method provides compensating of the impact of dispersion of the comparator on the generation of the sequence of excitation signals to excite the oscillator structure of the crystal oscillator.

According to a further example the crystal oscillator is operated in a calibration mode and the crystal oscillator is subsequently operated in a startup mode. Typically, the crystal oscillator is operated only once in the calibration mode. When in the calibration mode digital data being indicative of the switching delay of the comparator is derived and stored in the digital storage. Once the digital data is stored in the digital storage the digital data can be used subsequently when the crystal oscillator is driven or operated in the ordinary operation mode. For this, it is of particular benefit when the digital storage is a one-time programmable digital storage.

Accordingly and when in the operation mode the digital data is retrieved from the digital storage and the timing signal is generated or modified on the basis of the comparative signal as provided by the comparator of the crystal oscillator and on the basis of the retrieved digital data. In this way and when in the operation mode the impact of comparator dispersion can be effectively compensated for.

According to another example the digital data includes numerous digital offset values assigned with a signal amplitude of the oscillation in the oscillator structure or assigned with a signal amplitude present at the first and/or the second input terminal of the comparator. Additionally or alternatively, the digital offset values are assigned with an ordinal number of the excitation signal of the sequence of excitation signals. Since the fast oscillating starting procedure to be conducted by the startup controller is rather deterministic it may be sufficient when an ordinal number of the excitation signals is assigned with the respective digital offset values. Every time the startup controller conducts a fast oscillation startup procedure with the crystal oscillator the signal strength or signal amplitude present at the input terminals of the comparator after e.g. a first, second referred ignition or excitation with the first, second referred excitation signal is always the same, the calibration of the comparator can be based on this ordinal number.

BRIEF DESCRIPTION OF THE DRAWINGS

In the following, an example of a crystal oscillator is illustrated in greater detail by making reference to the drawings, in which.

DETAILED DESCRIPTION

Figure 1:
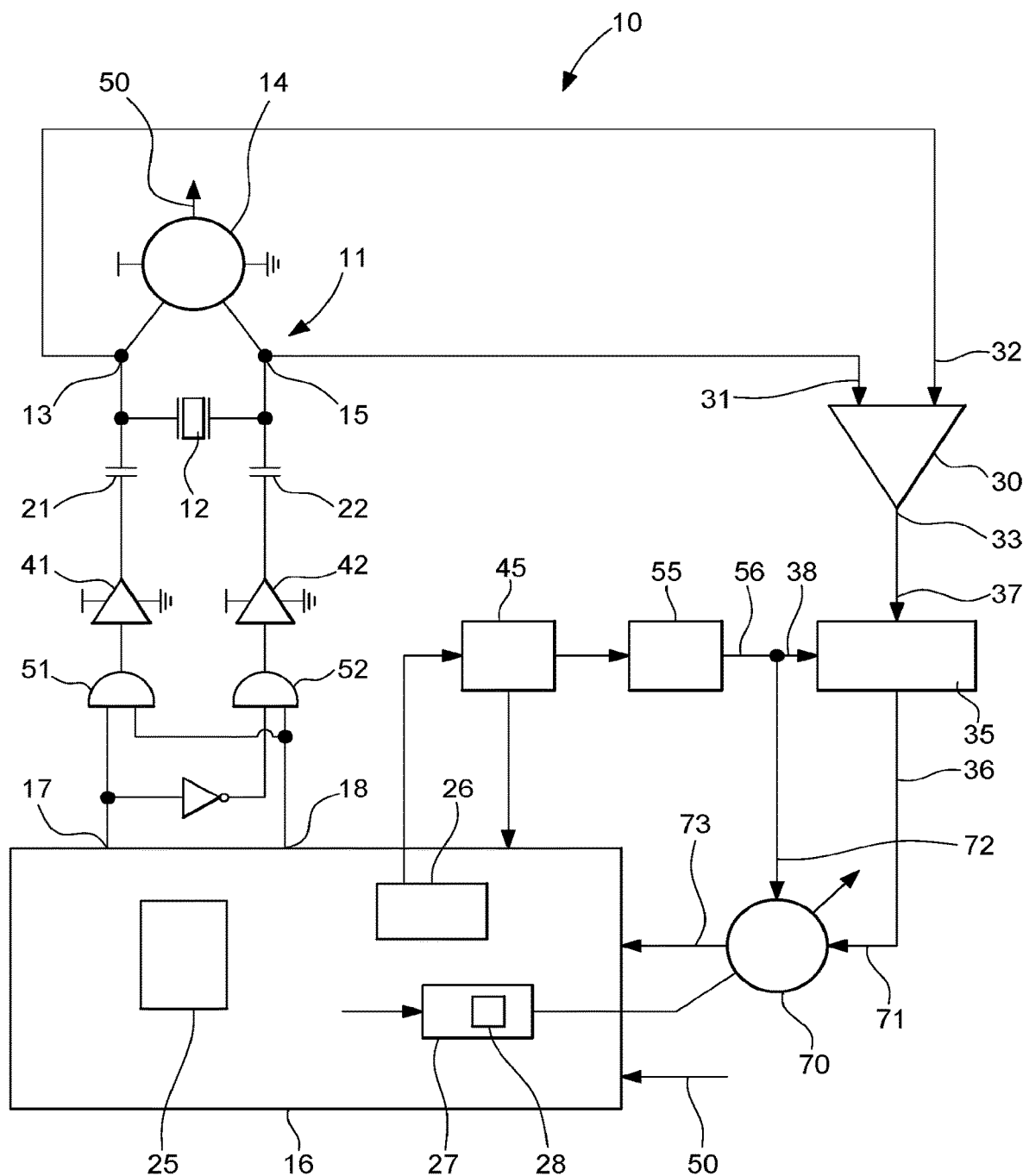
FIG. 1: schematically illustrates a block diagram of an example of the crystal oscillator.

In FIG. 1 an example of the crystal oscillator 10 is schematically illustrated. The crystal oscillator 10 comprises an oscillator structure 11. The oscillator 11 comprises a crystal resonator 12 and an electronic oscillator circuit 14. The crystal resonator 12 is electrically coupled to the electronic oscillator circuit 14. Typically, the crystal resonator 12 is connected in parallel to the electronic oscillator circuit 14. The oscillator structure 11 comprises a first terminal 13 and a second terminal 15. First and second terminals are connected to respective first and second terminals of the crystal resonator 12 and the electronic oscillator circuit 14. The electronic oscillator circuit 14 comprises an output terminal 50 configured to provide a master clock signal to be used by an electronic device 100, e.g. by a wearable electronic device such as a wristwatch.

The crystal oscillator 10 further comprises a startup controller 16 configured and operable to conduct a fast oscillation startup procedure with the crystal oscillator 10. The startup controller 16 typically comprises a processor 25 as well as a memory 26 and a further memory or storage 27. The crystal oscillator 10 is further equipped with a comparator 30. The comparator 30 comprises a first input terminal 31 connected to the first terminal 13. The comparator further comprises a second input terminal 32 connected to the second terminal 15 of the oscillator structure 11. The master clock signal may be also present to or may be fed back to the startup controller 16.

The crystal oscillator 10 further comprises a synchronizer 35. The synchronizer 35 comprises an input terminal also denoted as a synchronizer input 37 or comparator output. The synchronizer input 37 is directly connected to an output terminal 33 of the comparator 30. In this way, a comparative signal being indicative of a comparison of first and second oscillation signals present at the first and second terminals 13, 15 can be provided to the synchronizer 35.

The crystal oscillator 10 further comprises an oscillator 45, typically implemented as a RC oscillator. Operation of the oscillator 45 may be governed by the startup controller 16. Here, numerous frequencies for driving the oscillator 45 may be stored in the storage 26. The oscillator 45 is further connected or coupled to a phase locked loop 55. The phase locked loop 55 comprises an output terminal 56 connected to a clock input 38 of the synchronizer 35. The output terminal 56 of the phase locked loop 55 as well as an output terminal 36 of the synchronizer 35 are individually connected or coupled to respective input terminals 72, 71 of a phase shifting unit 70. The phase shifting unit is coupled to a digital memory 27.

The digital memory 27 may be provided with a lookup table 28. As indicated in FIG. 1 the phase shifting unit 70 is coupled to the digital storage 27 and is hence configured to read out or to retrieve digital data stored in the digital storage 27. Typically, the digital data provided by the digital storage is indicative of or characterizes a switching delay of the comparator 30. In this way the switching delay of the comparator 30 and hence the effect or the impact of dispersion of the comparator 30 of the comparative signal generated by the comparator 30 can be effectively compensated by the phase shifting unit 70. The phase shifting unit 70 comprises an output terminal 73 connected to the startup controller 16.

The signals provided at the output terminal 73 and fed back into the startup controller 16 can be used as timing signals by way of which the startup controller 16 and/or its processor 25 triggers the generation of an oscillation signal.

Typically and as further illustrated in FIG. 1 the startup controller 16 comprises a phase output 17 connected to a first and a second logic gates 51, 52. The input of the second logic gate 52 is inverted compared to the input of the first logic gate 51. Both logic gates 51, 52 are further connected to a startup control output 18. An output of the first and second logic gates 51, 52, e.g. implemented as logic AND gates, is connected or coupled to first and second buffer amplifiers 41, 42. Respective outputs of the first and second buffer amplifiers 41, 42 are connected to first and second capacitors 21, 22. The capacitors 21, 22 are driven in a phase shifted mode by the startup controller 16. In this way a sequence of excitation signal 110, 112, 114 as schematically shown in FIG. 4 can be excited into the oscillator structure 11.

As indicated in FIG. 1 the first capacitor 21 is connected in series between the output of the first buffer amplifier 41 and a first terminal of the crystal resonator 12. The second capacitor 22 is connected in series with a second terminal of the crystal resonator 12 and the second buffer amplifier 42.

The terminals of first and second capacitors 21, 22 connected to respective terminals of the crystal resonator 12 are also connected in series with the first and second terminals 13, 15 of the oscillator structure 11, respectively.

Figure 4:
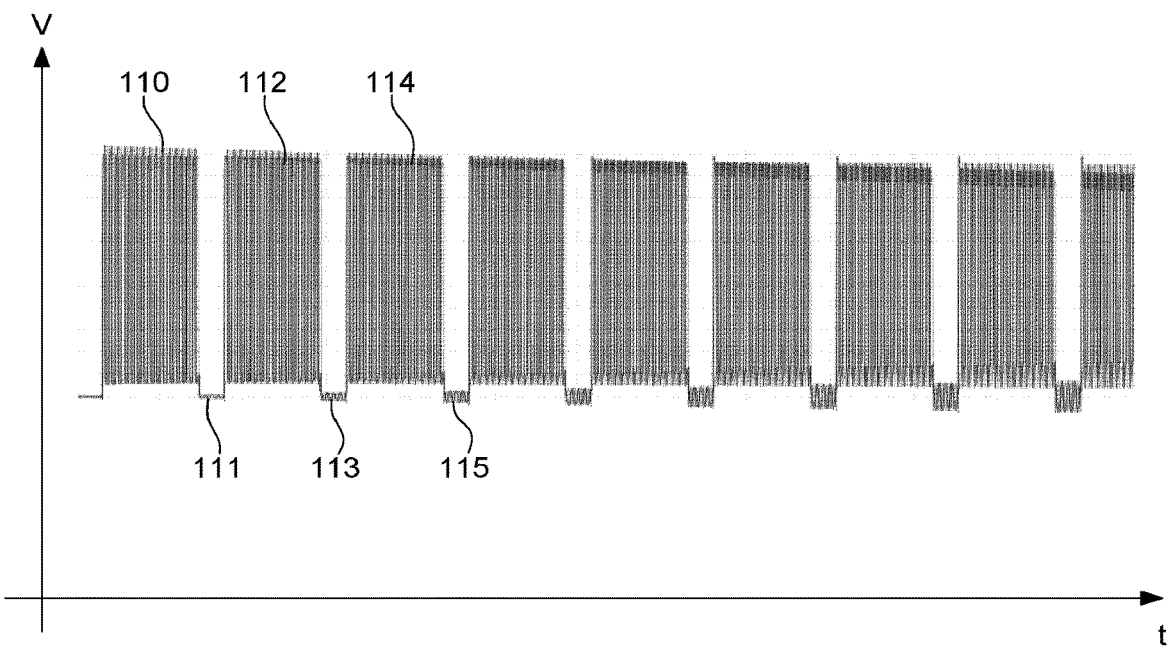
FIG. 4: is illustrative of a sequence of a excitation signals over time during a startup phase of the crystal oscillator.

During a fast oscillation startup procedure the startup controller 16 is operable to generate a first excitation signal 110 as illustrated in FIG. 4. The first excitation signal 110 is present at the phase output 17 of the startup controller 16. The first excitation signal 110, which is typically of a first frequency is excited into or towards the oscillator structure 11 for a predefined time interval. Thereafter the excitation stops. In response to the excitation by the first excitation signal 110 the oscillator structure 11 starts to oscillate and a respective oscillation signal 111 can be detected at the first and second terminals 13, 15.

After a predefined time interval the startup controller 16 excites the oscillator structure 11 with a further, hence with a second excitation signal 112. The second excitation signal 112 should be precisely triggered by making use of a timing signal. The timing signal is finally provided by the phase shifting unit 20. The timing signal is derived from the comparative signal at the output terminal 33 of the comparator 30. The comparative signal is synchronized by means of the synchronizer 35 with the clock signal as provided by the oscillator 45 and the phase locked loop 55.

The process of generating a sequence of a number of excitation signals 110, 112, 114 and so on is repeated numerous times. As indicated in FIG. 4, the individual oscillation signals 111, 113, 115 detectable between the consecutive excitation signals 110, 112, 114 comprises an increasing amplitude. The variation and the increase of the amplitude of the oscillation signals 111, 113, 115 causes variations of the switching delay of the comparator 30. This phenomenon, also known as dispersion can be effectively compensated by characterizing the switching delay of the comparator 30 as a function of signal amplitude present at the input terminals 31, 32 of the comparator 30.

The data characterizing the switching delay and/or the dispersion of the comparator 30 is stored as digital data and/or as digital offset values in the lookup table 28 of the digital storage 27. Now and when the startup controller 16 generates a sequence of excitation signals 110, 112, 114 the digital data provided by the digital storage 27 is taken into account to adjust or to compensate the dispersion of the comparator 30. In this way the timing signals provided at the output terminal 73 of the phase shifting unit 70 can be effectively used to compensate the detrimental impact of comparator dispersion for generating and using a timing signal to excite the oscillator structure 11 with the sequence of excitation signals.

Figure 2:
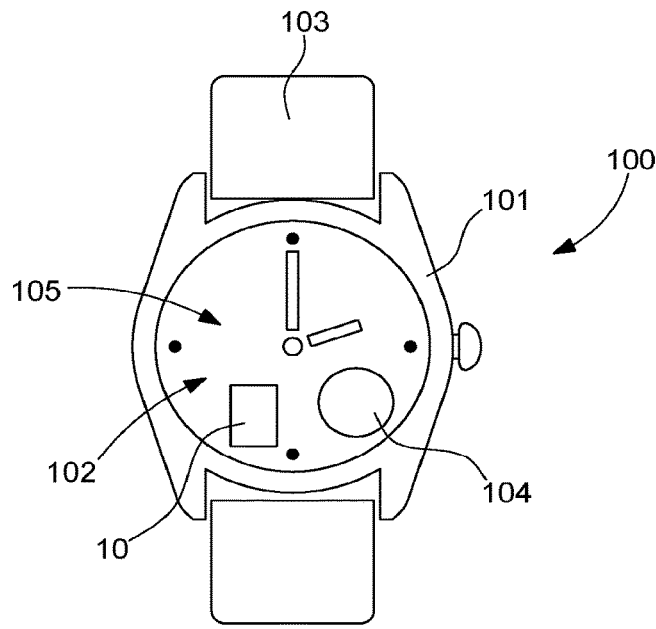
FIG. 2: schematically shows an example of a portable electronic device equipped with the crystal oscillator.

In FIG. 2, an example of a portable electronic device 100 implemented as a wristwatch is illustrated. The portable electronic device 100 comprises a housing 110 and a wristband 103. The electronic device 100 is further provided with a clockwork mechanism 105 connected or coupled with a display 102. As only briefly indicated in FIG. 2 the electronic device is further equipped with an electronic energy source 104, such as a battery and with a crystal oscillator 10 as described above. The crystal oscillator 10 provides a well-defined, frequency-stabilized and hence a rather precise clock signal.

Figure 3:
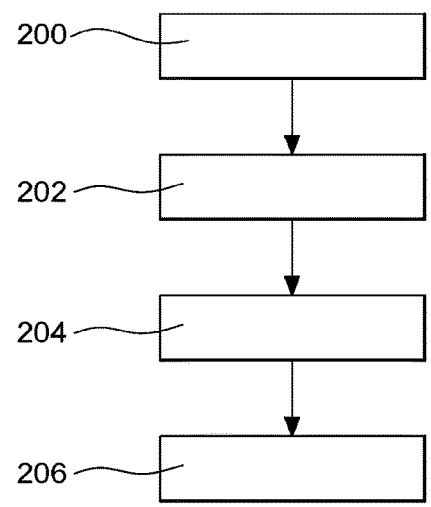
FIG. 3: shows a flowchart of a method of initiating operation of the crystal oscillator

Finally, in FIG. 3 a flowchart of a method In FIG. 3 numerous steps of a method of initiating operation of the crystal oscillators are illustrated in a flowchart. There, in a first step 200 a timing signal is provided and a first excitation signal is generated. The oscillation in the oscillator structure 11 of a crystal oscillator 10 is excited by means of the first excitation signal 110 as triggered by the respective timing signal. In a subsequent step 202 a comparative signal is derived by using the comparator 30. The comparative signal is derived from the oscillation signal 111 present at the first and second terminals 13, 15 of the oscillator structure 11. In a further and subsequent step 204 digital data being indicative of a switching delay of the comparator or being indicative of the dispersion of the comparator 30 is retrieved from the digital storage 27. Thereafter and in a further step 206 a further timing signal is generated on the basis of the comparative signal and on the basis of the digital data for exciting the oscillator structure 11 with a second, hence with a subsequent excitation signal 112. The sequence of steps 200-206 is repeated multiple times. For each excitation signal generated in step 200 a suitable timing signal is generated on the basis of the digital data provided by the digital storage 27.

REFERENCE NUMBERS 10 crystal oscillators
11 oscillator structure
12 crystal resonator
13 terminal
14 electronic oscillator circuit
15 terminal
16 startup controller
17 phase output
18 startup control output
21 capacitor
22 capacitor
25 processor
26 memory
27 memory
28 lookup table
30 comparator
31 input terminal
32 input terminal
33 output terminal
35 synchronizer
36 output terminal
37 synchronizer input
38 clock input
41 buffer amplifier
42 buffer amplifier
45 oscillator
50 output terminal
51 logic gate
52 logic gate
55 phase locked loop
56 output terminal
70 phase shifting unit
71 input terminal
72 input terminal
73 output terminal
100 electronic device
101 housing
102 display
103 wristband
104 electric energy source
105 clockwork mechanism
110 excitation signal
111 oscillation signal
112 excitation signal
113 oscillation signal
114 excitation signal
115 oscillation signal

The invention claimed is:

1. A crystal oscillator comprising:
an oscillator structure comprising a crystal resonator and an electronic oscillator circuit connected to the crystal resonator, the oscillator structure having a first terminal and a second terminal,
a startup controller operable to initiate an oscillation in the oscillator structure by exciting the oscillator structure with a sequence of excitation signals derivable from a clock signal and when triggered by a timing signal, the sequence of excitation signals includes at least a first excitation signal and a second excitation signal,
a comparator comprising a first and a second input terminals and an output terminal, wherein the first input terminal is connected to the first terminal and wherein the second input terminal is connected to the second terminal, the comparator being operable to provide a comparative signal, wherein:
a digital storage configured to store digital data characterizing a switching delay of the comparator and
a phase shifting unit coupled to the digital storage and coupled to the output terminal of the comparator, the phase shifting unit being operable to generate or to modify the timing signal on the basis of the comparative signal and on the basis of the digital data provided by the digital storage.

2. The crystal oscillator according to claim 1, wherein the digital storage comprises a lookup table, the lookup table comprising a number of signal amplitudes and/or an ordinal number of excitation signals each assigned to a switching delay of the comparator.

3. The crystal oscillator according to claim 1, wherein the digital data stored in the digital storage comprises at least a first digital offset value for the first excitation signal and a second digital offset value for the second excitation signal.

4. The crystal oscillator according to claim 1, wherein the startup controller or the phase shifting unit being operable to select a digital offset value from the digital storage on the basis of a signal amplitude of the oscillation in the oscillator structure and/or on the basis of an ordinal number of an excitation signal of the sequence of excitation signals.

5. The crystal oscillator according to claim 1, wherein the startup controller being operable in a calibration mode, wherein switching delays of the comparator for a sequence of excitation signals are measured or determined and wherein the digital data to be stored in the digital storage is derived from the measured switching delays of the comparator.

6. The crystal oscillator according to claim 1, wherein the digital data stored in the digital storage is derived from the measured switching delay of the comparator such that the timing signal is generated or modified to effectively compensate the switching delay of the comparator.

7. The crystal oscillator according to claim 1, wherein the digital storage comprises a one-time programmable memory.

8. The crystal oscillator according to claim 1, further comprising a synchronizer, the synchronizer comprising a clock input, a synchronizer input or comparator output and a synchronizer output, the synchronizer input or comparator output being connected to the output terminal of the comparator and the synchronizer output being connected to an input terminal of the phase shifting unit.

9. The crystal oscillator according to claim 8, wherein the synchronizer is operable to generate the timing signal on the basis of signals obtained via the clock input and via the synchronizer input or comparator output.

10. The crystal oscillator according to claim 1, further comprising an oscillator coupled to a phase locked loop, wherein an output terminal of the phase locked loop is connected to an input terminal of the phase shifting unit and/or to the clock input of the synchronizer.

11. A portable electronic device comprising a housing, an electric source of energy and a crystal oscillator according to claim 1, and arranged inside the housing, wherein the crystal oscillator is driven by the electric source of energy.

12. The portable electronic device according to claim 11, further comprising a display and a clockwork mechanism operably connected to the display, wherein the clockwork mechanism comprises the crystal oscillator.

13. A method of initiating operation of a crystal oscillator, the method comprising the steps of:

providing a timing signal, generating a first excitation signal and initiating an oscillation in an oscillator structure of a crystal oscillator according to claim 1, by exciting the oscillator structure with the first excitation signal triggered by the timing signal, deriving of a comparative signal by using the comparator connected to first and second terminals of the oscillator structure, wherein:

deriving digital data being indicative of a switching delay of the comparator and storing the digital data in a digital storage, or retrieving digital data being indicative of a switching delay of the comparator from a digital storage and generating or modifying the timing signal on the basis of the comparative signal and on the basis of the digital data for exciting the oscillator structure with a second excitation signal.

14. The method according to claim 13, wherein the crystal oscillator is operated in a calibration mode and is subsequently operated in a startup mode, wherein when in the calibration mode digital data being indicative of the switching delay of the comparator is derived and stored in the digital storage, and wherein when in the operation mode the digital data is retrieved from the digital storage and the timing signal is generated or modified on the basis of the comparative signal and the retrieved digital data.

15. The method according to claim 13, wherein the digital data includes numerous digital offset values assigned with a signal amplitude of the oscillation in the oscillator structure and/or assigned with an ordinal number of the first excitation signal.

* * * * *